(12) United States Patent
Mizutani et al.

(10) Patent No.: US 6,566,022 B2
(45) Date of Patent: May 20, 2003

(54) MICRO DEVICES MANUFACTURING METHOD AND APPARATUS THEREFOR

(75) Inventors: Shinji Mizutani, Kanagawa-ken (JP); Kazuya Ota, Tokyo (JP); Masahiko Yasuda, Kanagawa-ken (JP)

(73) Assignee: Nikon Corporation, Tokyo (JP)

(*) Notice: Subject to any disclaimer, the term of this patent is extended or adjusted under 35 U.S.C. 154(b) by 0 days.

(21) Appl. No.: 09/930,310

(22) Filed: Aug. 16, 2001

(65) Prior Publication Data

US 2002/0001761 A1 Jan. 3, 2002

Related U.S. Application Data

(62) Division of application No. 09/476,208, filed on Dec. 30, 1999, now Pat. No. 6,306,548, which is a division of application No. 09/192,439, filed on Nov. 16, 1998, now Pat. No. 6,110,021, which is a continuation of application No. 08/759,326, filed on Dec. 2, 1996, now abandoned, which is a division of application No. 08/457,232, filed on Jun. 1, 1995, now Pat. No. 5,601,957.

(30) Foreign Application Priority Data

Jun. 16, 1994 (JP) ............................................. 6-134006
Jul. 13, 1994 (JP) ............................................. 6-183002

(51) Int. Cl.⁷ .............................. G03F 9/00; G03C 5/00
(52) U.S. Cl. ............................................. 430/5; 430/22
(58) Field of Search ............................. 430/22, 5, 312, 430/313, 394; 356/399, 401

(56) References Cited

U.S. PATENT DOCUMENTS

| 3,841,031 A | 10/1974 | Walsh ........................... 51/283 |
| 5,334,466 A | 8/1994 | Yasui et al. ..................... 430/5 |
| 5,435,772 A | 7/1995 | Yu ................................ 451/63 |
| 5,486,131 A | 1/1996 | Cesna et al. ................. 451/159 |
| 5,498,500 A | 3/1996 | Bae et al. ....................... 430/22 |

FOREIGN PATENT DOCUMENTS

| JP | 6-134006 | * 6/1994 |
| JP | 6-183002 | * 7/1994 |

* cited by examiner

Primary Examiner—S. Rosasco
(74) Attorney, Agent, or Firm—Armstrong Westerman & Hattori, LLP

(57) ABSTRACT

An exposure method according to the present invention includes a first step of forming on a substrate an alignment mark including a concave and convex pattern; a second step of forming a coat over said alignment mark and the other area on said substrate; a third step of flattening said coat; and a fourth step of applying a photosensitive material on said coat flattened by said third step and projecting a mask pattern thereto. The alignment mark is formed by said concave and convex pattern arranged with a pitch which is smaller than the predetermined value between adjacent convex portions having a width of not less than a predetermined value.

19 Claims, 10 Drawing Sheets

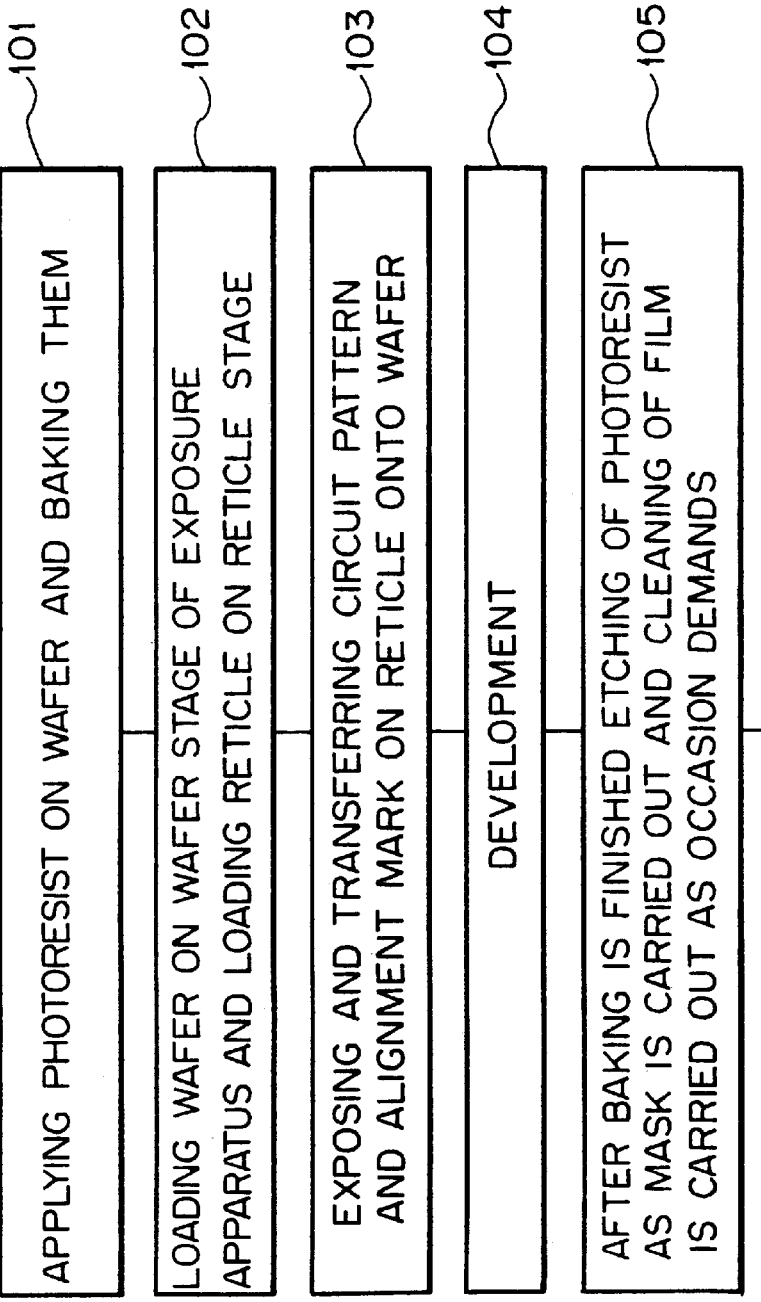

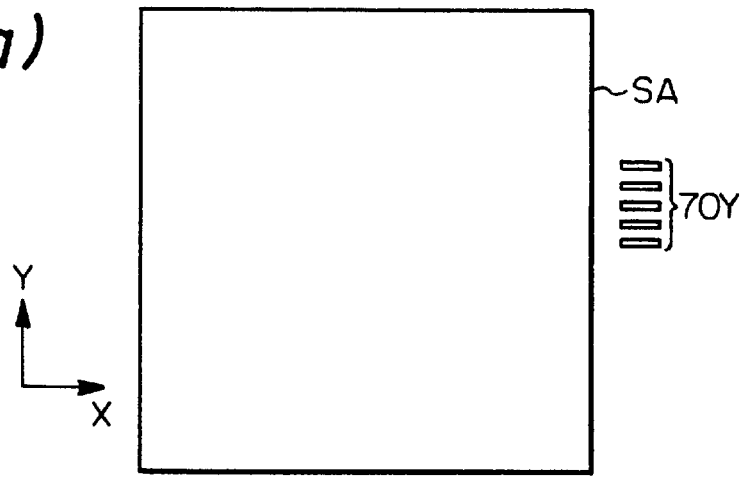
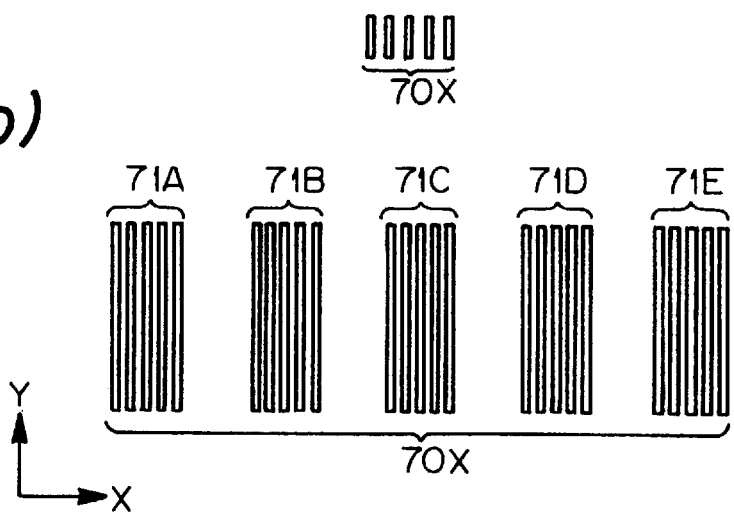
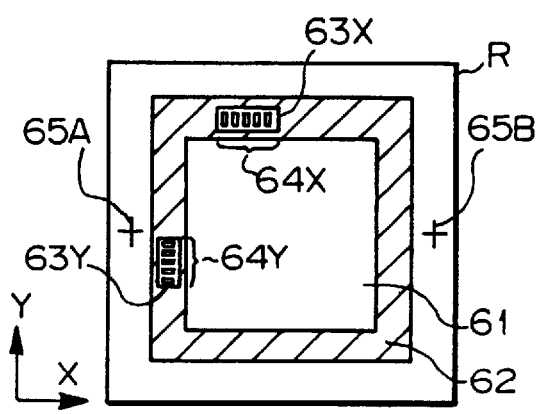
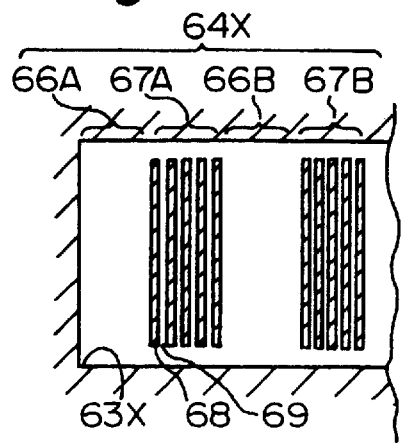

MICRO DEVICES MANUFACTURING METHOD AND APPARATUS THEREFOR

This application is a division of prior application Ser. No. 09/476,208 filed Dec. 30, 1999 now U.S. Pat. No. 8,306,548, which is a division of Ser. No. 09/192,439 filed Nov. 16, 1998 now U.S. Pat. No. 6,110,031, which is a continuation of prior application Ser. No. 08/759,326 filed Dec. 2, 1996 now abandoned; which is a divisional of Ser. No. 08/457,232 filed Jun. 1, 1995, now U.S. Pat. No. 5,601,957.

BACKGROUND OF THE INVENTION

1. Field of the Invention

The present invention relates to a micro device manufacturing method and an apparatus therefor, and in particular, to an exposure method and a substrate polishing apparatus in manufacturing micro devices such as semiconductor devices, liquid crystal display devices, etc.

2. Related Background Arts

In the case where micro devices such as semiconductor devices, liquid crystal display devices and the like are manufactured, there has usually been used an exposure apparatus which exposes a pattern formed on a reticle (or a photo mask and the like) onto a shot area on a wafer (or a glass plate and the like) on which a photosensitive material is applied. For this kind of exposure apparatus, an exposure apparatus of a so-called step-and-repeat type has been frequently used which repeat operations of sequentially exposing the pattern on the reticle onto the shot area on a wafer. Recently, there has been developed a projection exposure apparatus of a so-called step-and-scan type which exposes the pattern on the reticle onto an area wider than an exposure field of a projection optical system by scanning the reticle and the wafer at the same time.

Incidentally, since a semiconductor device is, for example, produced by superimposing a plurality of layers of circuit patterns on the wafer, when circuit patterns of a second layer or a later layer are exposed on the wafer, alignment of each shot area of the wafer already formed with the circuit pattern with the pattern image of the reticle, that is alignment of the wafer with the reticle, must be precisely performed. For this purpose, there has been usually adopted a method wherein one or more wafer masks for alignment are formed on the wafer together with the reticle pattern and the wafer marks are used for aligning the circuit patterns of a subsequent layer.

There are several alignment sensors used for measuring the position of a wafer mark, which systems include an LSA (Laser Step Alignment) system which measures the position of a mark by irradiating a laser beam to a wafer mark on a wafer and detecting a diffracted and/or diffused light, an FIA (Field Image Alignment) system which measures the position of the wafer by image processing the wafer mark illuminated by a light emitted by a halogen lamp and having a wide wavelength band width, or an LIA (Laser Interferometric Alignment) system which measures the position of the wafer mark by irradiation with bi-directional laser beams, the frequencies of which are slightly different, causing two diffracted beams to interfere with each other and then detects the phase of the interfered beams. Of these systems, the LIA system conforms to a flattening technique explained hereinafter, since it is most effective to detect the position of the wafer mark on the wafer which has a rough surface or a surface difference in level which is small.

Incidentally, the shape, number or size of the wafer mark for alignment is selected in correspondence with resolution of the projection optical system of the exposure apparatus, a required accuracy in alignment, a condition of layer on the wafer, etc. There have usually been used many kinds of shapes, such as slit-like shape, dot-like shape or cross-like shape. However, in the past, most of these wafer marks have had relatively large recesses or concave portions (having 4 $\mu$m width, 6 $\mu$m width and the like) and are formed with a concave and convex pattern, said pattern being periodically arranged between adjacent convex portions.

Multi-layer interconnection is a requisite of high integration and high densification as seen in a super LSI. In this technology, a technique for flattening the surface of a film or membrane of a predetermined layer is very important. This flattening technique is indispensable not only for realizing multi-layer interconnection but also for a process of producing an integrated circuit of the multi-layer structure. Such a flattening technique is usually performed by a chemical method such as an anodic oxidation method, a resin coating method, a glass flow method, an etch back method, a lift off method, a bias spatter method and the like. However, in addition to the above methods, a process (a chemical and mechanical polishing process) for chemically and mechanically polishing the surface of the film formed on the substrate by the above mentioned method is practiced as occasion demands.

A general structure of a substrate polishing apparatus for polishing the surface of a film on the substrate is shown in FIG. 12. In FIG. 12, a wafer 124 is held by vacuum suction by means of a vacuum suction table 125 with a surface 124a (hereinafter referred to as pattern formation surface) on which a pattern layer and an upper layer film or membrane are formed. The wafer 124 held by vacuum suction on the vacuum suction table 125 is rotatable in the direction of rotation 300B of a rotary table 136, since the vacuum suction table 125 is placed on a rotary table 126 which can rotate in one direction.

A polishing surface plate 122 having a polishing pad 123 is disposed at a position that faces with the pattern formation surface 124a of the wafer 124 on the suction table 125. The polishing pad 123 rocks or oscillates in the same direction as the movement of a rocking table 121, since the polishing surface plate 122 is held by the rocking table 121.

Moreover, a polishing agent supplying nozzle 127 for supplying a polishing agent to the pattern formation surface is provided. The polishing agent is supplied by the polishing agent supplying nozzle 127 between the pattern formation surface 124a and the polishing pad 123 and at the same time at least one of the vacuum suction tables 125 and the polishing surface plate 122 moves upward and downward direction 300A to cause the polishing pad 123 moving in response to rocking movement of the rocking table 121 and the wafer 124 rotating in response to the rotation of the rotary table 126 to contact, thereby polishing the pattern formation surface 124a (the upper most film formed on the upper layer of pattern layers) on the substrate 124.

However, when the flattening process is performed by chemical and mechanical polishing, a phenomenon of so-called dishing which creates a dish-like concave portion or depression on the surface of the film or membrane results, if there is one or more concave portions or recesses having a width of not less than 2 $\mu$m on an under layer pattern of a metallic film or membrane which is beneath the film to be flattened. Accordingly, a same phenomenon such as stated above will occur on the surface of the membrane formed on a concave and convex pattern, if the wafer mark has relatively large concave portion (4 $\mu$m width, 6 $\mu$m width and the like) like a conventional wafer mark and if they are formed only by periodically arranged concave and convex patterns. A state of the dishing is shown in FIGS. 8(a) and 8(b).

FIG. 8(a) shows a state wherein an oxide film or membrane 92 is formed on a substrate 93 such as a wafer and recess or concave portion 90a has been formed in the oxide film by an etching, thereafter, a metallic coat 91 is formed on the oxide film by a spattering of aluminum. FIG. 8(b) shows the state wherein said chemical and mechanical polishing is thereafter practiced on a product shown in FIG. 8(a). In FIG. 8(b) a dish-like portion D1 is created by dishing above the concave portion 90a when the width of the concave portion 90a is not less than 2 μm. Dishing as shown in FIG. 8(b) is caused when a pattern in which a plurality of concave portions or recesses 90b are periodically arranged is formed on a substrate and the metallic coat 91 is coated on the pattern. In this case, if a chemical and mechanical polishing is practiced on the coat, a large dish-like portion D2 is created by dishing above the concave portions 90b as shown in FIG. 9(b). Accordingly, when a wafer mark M including a line and space pattern formed by periodically arranging convex portions 90c as shown in FIG. 9(c) is used, a large dish-like portion D3 is created by dishing above the wafer mark M. For this reason, an observed image of the wafer mark is distorted when it is detected by the alignment system and accuracy of alignment is reduced.

If the pattern formation surface (the upper most film formed of the pattern layer) is polished using the above mentioned substrate polishing apparatus, there is a problem that the thickness of the film, particularly, at a position between a pattern and the other pattern adjacent to the former pattern becomes asymmetrical.

For example, in FIG. 12, there is provided with the polishing surface plate 122 rocking leftward and rightward 300A with respect to the wafer 124 rotating in response to the rotation of the rotary table 126. However, since a relative polishing direction between the wafer and the polishing pad becomes always constant, when the cross-section of the wafer 124 is observed, a polishing force (intensity of polishing) at a region $R_{1y}$, $R_{2y}$ (hereinafter referred to as a region between patterns) between a pattern $Y_1$ formed on the wafer 124 and other patterns $Y_s$, $Y_3$ adjacent to the pattern $Y_1$ offsets in the regions $R_{1y}$, $R_{2y}$ between the patterns and therefore, the surface 124a is partially and deeply ground in said regions $R_{1y}$, $R_{2y}$ to cause the film thickness 34b of the regions $R_{1y}$, $R_{2y}$ between the patterns to become asymmetrical.

If the film thickness of the upper layer film at a region between the patterns constituting the alignment mark becomes asymmetrical, there is an occasion that a detecting position of the alignment mark is displaced.

SUMMARY OF THE INVENTION

The main object of the present invention is to provide an improved exposure method which eliminates the defects of conventional exposing method as stated hereinbefore.

Another object of the present invention is to provide an exposure method which does not create a dish-like portion on an alignment mark even when a flattening process is performed on the alignment mark (wafer mark).

A further object of the present invention is to provide a mask for use in the above method.

The further object of the present invention is to provide a polishing apparatus which can symmetrize the film thickness of every pattern when the film (particularly alignment mark) above the patterns is ground thereby.

An exposure method according to the present invention includes a first step of forming on a substrate an alignment mark including a concave and convex pattern, said mark being formed by the concave and convex pattern disposed with a pitch which is smaller than the predetermined value between adjacent convex portions having a width of not less than a predetermined value; a second step of forming a coat over said alignment mark and the other area on said substrate; a third step of flattening said coat; and a fourth step of applying a photosensitive material on said coat flattened by said third step and projecting a mask pattern thereto.

In one embodiment of the above exposure method, the distance between said adjacent convex portions of said alignment mark having a width of not less than a predetermined value is not less than 2 μm.

A mask formed with an original pattern of alignment mark together with a pattern to be transferred according to the present invention, is structured such that the original pattern of said alignment mark is formed by disposing, between adjacent bright portions having a width of not less than a predetermined value, one or more bright patterns having a width of less than said predetermined value with a pitch less than said predetermined value.

A mask formed with an original pattern of alignment mark together with a pattern to be transferred according to the present invention, is structured such that the original pattern of said alignment mark is formed by disposing, between adjacent dark portions having a width of not less than a predetermined value, one or more dark patterns having a width less than said predetermined value with a pitch less than said predetermined value.

A substrate polishing apparatus according to the present invention includes a first holding member for holding a polishing member adapted to polish the substrate; a second holding member for holding the substrate such that the surface on the substrate faces the polishing member; rotary member for relatively rotating said first holding member and said second holding member with respect to each other; and a change-over member for changing the direction of relative rotation between said first holding member and said second holding member.

According to the present exposing method, creation of dish-like portions on the alignment mark by dishing when the flattening process is performed is prevented, since the width of an opening of a recess or concave portion formed on the substrate is reduced by forming sub-patterns in an area or region which is conventionally a recessed portion. Thus no distortion of the mark is created and highly accurate alignment can be attained. In the exposing method according to the present invention, the distance between adjacent projections or convex portions of a main pattern of the alignment mark can be set to be not less than a resolution of the alignment sensor and the distance between adjacent projections or convex portions or depressions of the sub-pattern can be set to be not more than the resolution of the alignment sensor. Therefore, it is possible to effect alignment of the wafer mark in the same manner as a conventional method by means of a conventional alignment sensor using a bright and dark pattern in which a main pattern and a sub-pattern correspond to a bright portion and a dark portion, respectively.

Although dish-like portion is easily created between the convex portions if the distance between adjacent convex portions, each having a width of not less than a predetermined value, of the alignment mark is not less than 2 μm, creation of dish-like portion is prevented by providing a sub-pattern between the convex portions. An alignment sensor having a less resolution can be used for alignment of the wafer mark.

Moreover, the alignment mark exposed and transferred on the substrate from the mask according to the present invention, includes the sub-pattern which is disposed between the adjacent convex portions of the main pattern having a width of not less than a predetermined value and formed by a concave and convex pattern arranged with a distance of not more than the predetermined value. Therefore, creation of the disk-like portions on the alignment mark is prevented and also creation of distortion in the mark is prevented, thereby enabling high precise alignment to be attained.

Since the substrate polishing apparatus according to the present invention includes the change-over member for changing a direction of rotation, it is possible to change the direction of relative rotation of the first holding member and the second holding member while the surface of the substrate (the upper most layer formed on the upper portion of the pattern layer) being polished.

Since the direction of rotation of the substrate is changed reversely while polishing, it is possible to prevent the cross-sectional shape in the thickness of the film in an area between the patterns from becoming asymmetrical. Needless to say that the direction of rotation corresponds to the direction of polishing by the polishing member with respect to the substrate and is relative to each other and therefore, the direction of rotation of the first and second holding member is not limited.

BRIEF DESCRIPTION OF THE DRAWINGS

FIG. 1 is a view showing a relationship between FIGS. 1(a) and 1(b); FIG. 1(a) shows the first half of a flow chart explaining exposure operation according to one embodiment of the present invention.

FIG. 5(a) is a plane view showing images of a circuit pattern and reticle mark exposed on the wafer; FIG. 5(b) is an enlarged plane view of a part of FIG. 5(a); FIG. 5(c) is a plane view showing a pattern arrangement of the reticle of the embodiment and FIG. 5(d) is an enlarged plane view showing a part of the reticle mark in FIG. 5(c).

DESCRIPTION OF THE PREFERRED EMBODIMENTS

Referring to the accompanying drawings, one embodiment of the present invention will be explained hereinafter.

Figure 3:
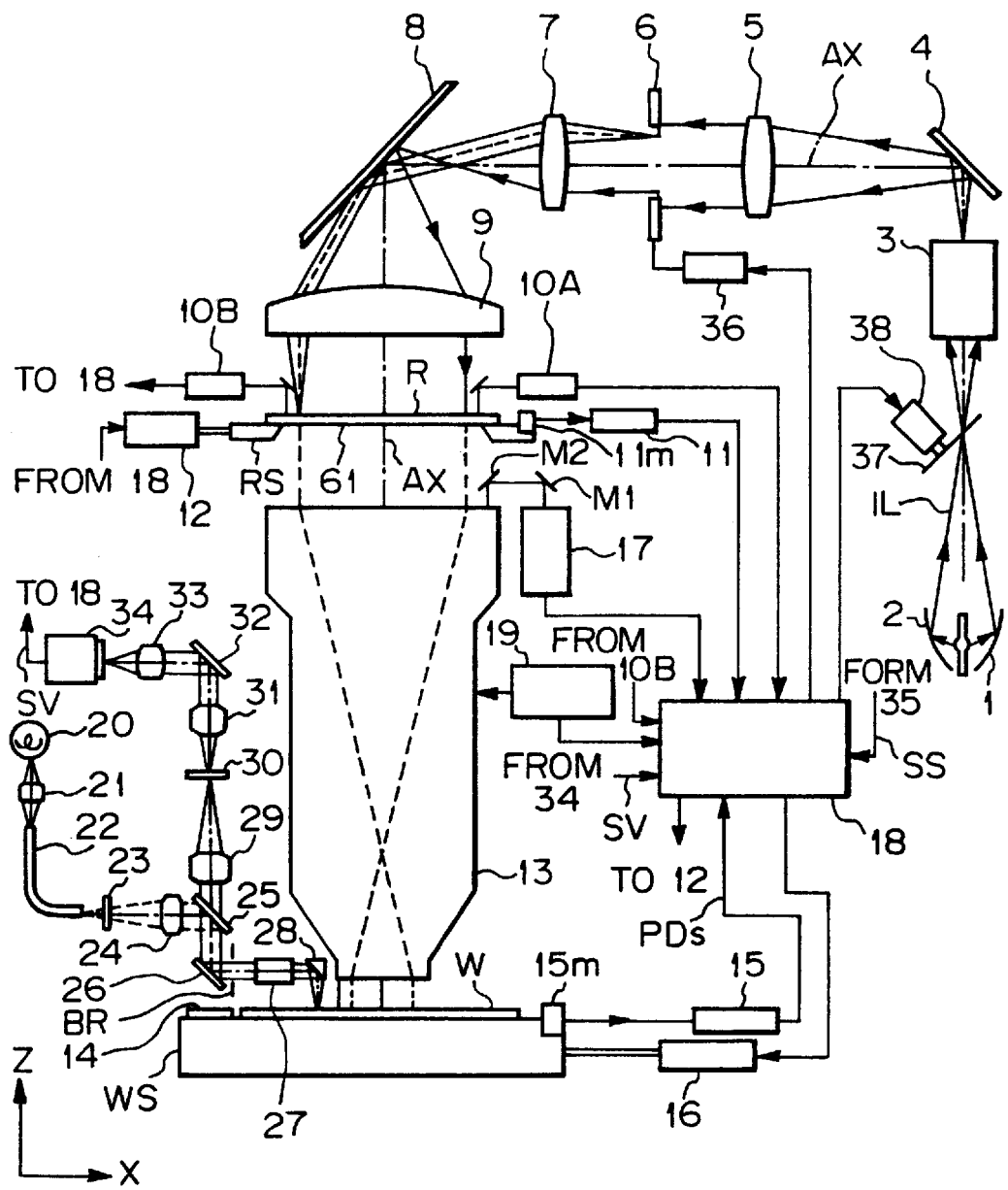
FIG. 3 is a structural view showing a projection exposure apparatus adapted to be used in practicing the exposure method of the embodiment.

FIG. 3 shows a schematic structure of a projection exposure apparatus adapted to be applied with the exposure method according to the present invention. In FIG. 3 an illumination light IL emitted from a high pressure mercury-vapor lamp 1 is reflected by an elliptical mirror 2 and is once collected at a second focal point, and thereafter enters into an illumination optical system 3 including a collimator lens, an interference filter, an optical integrator (fly-eye lens), and an aperture stop (σ stop). Although the fly-eye lens is not shown, it is arranged within a plane perpendicular to an optical axis such that a focal surface thereof at a side of the reticle coincides with a Fourier transform surface (a pupil conjugate surface).

There is disposed adjacent to the second focal point of the elliptical mirror 2 a shutter (for example a rotary shutter having four blades) which closes and opens a passage of the illumination light IL by a motor 38. A laser beam such as the excimer laser (KrF excimer laser, ArF exoimer laser) and the like, or a high harmonic wave such as the metallic vapor laser or YAG laser may be used as the illumination light for exposure other than the high pressure mercury-vapor lamp 1.

In FIG. 3, most of the illumination light (such as an i beam and the like) emitted from the illumination optical system 3 and having a wavelength band to which a photoresist is sensitive is reflected by a beam splitter 4 and then come to a mirror 8 after passing through a first relay lens 5, a variable field stop (reticle blind) and a second relay lens 7. The illumination light reflected by a mirror 8 in substantially downward direction which is perpendicular to the optical axis of the illumination light illuminates with uniform illuminance a pattern area of the reticle R through a main condenser lens 9. A surface on which the reticle blind 6 is arranged is in conjugate relationship (image formation relationship) with a pattern formation surface of the reticle R and an illumination field of the reticle R can be optionally set by opening and closing a plurality of movable blades constituting a reticle blind by means of a drive system to change the size and the shape of an opening.

It is presumed that a Z axis is parallel with the optical axis AX of the illumination optical system which intersects the reticle R, an X axis is in a plane perpendicular to the Z axis and is parallel with a surface of the paper of FIG. 3 and a Y axis is perpendicular to the surface of the paper of FIG. 3.

FIG. 5(c) shows the reticle R according to the present embodiment. In the reticle R shown in FIG. 5(c), reticle marks 64X and 64Y are formed as alignment marks at substantially central positions of two sections of a shading band 62 which surrounds a pattern area or region 61. The two sections of the shading band intersect each other at right angle. An image of the reticle marks are formed on the substrate or wafer W as wafer marks having a concave and convex pattern by projecting the image of the reticle marks onto the wafer and developing it. These reticle marks 64X and 64Y may be commonly used as alignment marks when the position of each shot area of the wafer W and the position of the reticle R is aligned or registered. These two reticle marks 64X and 64Y have the same structure (direction thereof is different from each other), each of which is formed by means of a shading film or coating of chromium or the like positioned within transparent windows 63X and 63Y formed in the shading band 62. Moreover, the reticle R has two alignment marks 65A and 65B which are formed near outer periphery thereof in opposite relation and consist of two cross-like shading marks. These two alignment marks 65A and 65B are used for aligning the reticle R (alignment of the position with respect to the axis of light).

Referring to FIGS. 5(c) and 5(d), reticle marks on the reticle R will be explained in detail hereinafter.

As shown in FIG. 5(c), the reticle marks consist of a reticle mark 64X for detecting the position in an X direction and a reticle mark 64Y for detecting the position in a Y direction. These reticle marks 64X and 64Y are constituted by five sub-marks disposed in a transparent or transmittivity portion. The reticle mark 64Y for detecting the position in the Y direction is turned 90° with respect to the reticle mark 64X for detecting the position in the X direction.

FIG. 5(d) shows a part of the structure of the reticle mark 64X for the X direction. In FIG. 5(d), the reticle mark 64X is structured by positioning, between adjacent transitivity portions 66A, 66B, . . . , each having the width in the X direction of not less than a predetermined value, sub-marks 67A, 67B, . . . , each having same width as that of the transmittivity portion. Each sub-mark 67A, 67B, . . . , is constituted by alternately disposing five slit-like shading films or membranes 68 and four transmittivity portions 69 with a predetermined distance in the X direction.

These sub-marks 67A, 67B, . . . , are spaced apart from each other with a distance of not less than a predetermined value. This distance, preferably, is determined considering a resolution of the alignment sensor. The distance between two adjacent sub-marks is determined so that a distance between adjacent two sub-patterns of the wafer mark formed on the wafer after sub-marks 67A, 67B, . . . , on the reticle are exposed and transferred to the wafer is not less than 2 μm. The shape of the sub-marks 67A, 67B, . . . , is not limited to that shown in FIG. 5(d). The reticle marks 64X, 64Y may be marks in which bright portions and dark portions are reversed.

The pitch distance between adjacent shading films 68 and the pitch distance between adjacent transmittivity portions 69 in the sub-marks 67A, 67B, . . . , are determined so that an image of the sub-marks becomes a size of not more than the resolution of the alignment sensor when the sub-marks are transferred onto the wafer. Although the sub-marks 67A, 67B . . . , in the reticle mark 64X, according to the present embodiment is a regular pattern, they may be an irregular pattern. However, the distance between adjacent bright portions or the distance between adjacent dark portions in the irregular pattern are, preferably, determined so that an internal structure of a sub-pattern on the wafer formed by the sub-marks has a fineness of not more than the resolution of the alignment sensor used for detecting the sub-pattern when the sub-marks are transferred onto the wafer. The reticle marks 64X and 64Y can be formed by a well known pattern generator or an electron beam drawing device.

Referring again to FIG. 3, the reticle R is set on a reticle stage RS which is precisely controlled, the movement thereof in the direction (Z direction) along an optical axis AX (this axis coincides with an optical axis of the illumination optical axis) of the projection optical system 13. The reticle stage is also two-dimensionally movable and rotatable little by little in the horizontal plane which is perpendicular to the axis AX. The rotation of the reticle stage is precisely controlled. Disposed and fixed on an end of the reticle stage RS is a movable mirror 11m which reflects a laser beam from a laser interferometric measuring machine (laser interferometer). The position of the reticle stage RS is always detected with resolving power, for example, in the order of 0.01 μm by the laser interferometer. Disposed above the reticle R are a reticle alignment systems (RA systems) 10A and 10B which detect two cross-shaped alignment marks 65A and 65B formed on the reticle adjacent to the outer periphery thereof. The reticle R is positioned so that the center point of a pattern area 61 coincides with the optical axis AX of the projection optical system 13 by slightly moving the reticle stage RS on the basis of measured signals from the RA system 10A and 10B.

The illumination light IL having passed through the pattern area 61 of the reticle R enters into the projection optical system 13 which is double telecentric and the projected image of a circuit pattern of the reticle R which is reduced into 1/5 times by the projection optical system is formed, in superimposed relation, in one of shot areas on the wafer which has a photoresist layer on the surface thereof and is held such that the surface of the photoresist coincides with the best image formation surface of the projection optical system.

The wafer W is held by a vacuum suction on a wafer holder (not shown) which is rotatable. The wafer stage WS is structured so that it can move two dimensionally in step-and-repeat method by a motor 16. The wafer stage WS is stepped to the next shot position after transfer exposure of the reticle R for one shot area on the wafer W is finished. Disposed and fixed on one end of the wafer stage WS is a movable mirror 15 which reflects a laser beam from a laser interferometer 15. The two-dimensional coordinates of the wafer stage WS is always detected with a resolving power, for example, in the order of 0.01 μm by the laser interferometer 15. The laser interferometer 15 measures coordinates of an X direction and a Y direction of the wafer stage WS. A stage coordinate system (a stationary coordinate system) (X,Y) of the wafer stage WS is determined by the coordinates in the X direction and the Y direction.

Namely, coordinate values of the wafer stage WS measured by the laser interferometer 15 are the coordinate values on the stage coordinate system.

A reference member (glass substrate) having a reference mark which is used when base line value (the distance between the reference point and the center of exposure of the alignment sensor) is measured is disposed on the wafer stage WS so that the level of the reference member is the same as the level of an exposure surface of the wafer W.

Provided for the projection exposure apparatus shown in FIG. 3 is an image formation characteristic compensator 19 capable of adjusting an image formation characteristic of the projection optical system 13. The image formation characteristic compensator 19 according to the present embodiment compensates the image formation characteristic, for example projection magnification or distortion of the projection optical system 13 by independently moving (movement in the direction parallel with the optical axis AX or inclination) a part of lens elements, particularly each of a plurality of lens elements near to the reticle R, constituting the projection optical system 13 using a piezoelectric-crystal element such as a piezo element.

Provided at one side of the projection optical system 13 is an alignment sensor (hereinafter referred to as "Field Image Alignment system (FIA system)") which image-processes by an off-axis method. In this embodiment, detection of the position of the wafer mark is performed by this FIA system. In this FIA system, a light emitted from a halogen lamp 20 is introduced into an interferometer 23 through a condenser lens 21 and an optical fiber 22. The light having a wavelength band to which the photoresist layer is sensitive and an infrared wavelength band is cut off in the interferometer 23. The light having been passed through the interferometer 23 enters into an objective lens 27 of double telecentric type through a lens system 24, a beam splitter 25, a mirror 26 and a field stop BR. Light having emitted from the objective lens 27 is reflected by a prism (or mirror) 28 fixed on the periphery of the lower portion of a lens barrel so that an illumination field of the projection optical system 13 is not shaded, and irradiates the wafer W in the direction substantially perpendicular to the surface of the wafer.

The light from the objective lens 27 is irradiated to a partial region including the wafer mark on the wafer W and light reflected from the partial region is introduced to a collimator mark or indicator plate 30 through the prism 28, the objective lens 27, the field stop BR, the mirror 26, the beam splitter 25 and a lens system 29. The indicator plate 30 is disposed in a plane which is conjugate with the wafer W relative to the objective lens 27 and the lens system 29, an image of the wafer mark on the wafer W is formed in a transparent window. Formed in the transparent window of the indicator plate 30 is an indicator mark which is formed by disposing two rectilinear marks extending in the Y direction and spaced in the X direction with a predetermined distance. The light having passed through the indicator plate 30 is introduced to an image pickup element (CCD camera and the like) through a first relay lens system 31, a mirror 32 and a second relay lens system 33 and an image of the wafer mark and an image of the indicator mark are formed on a light receiving surface of the image pickup element. An image pickup signal SV from the image pickup element 34 is supplied to a main control system 18 wherein the position (a coordinate value) of the X direction of the wafer mark is calculated. Another FIA system (FIA system for a Y axis) for detecting the position of the wafer mark in the Y direction is provided other than the above mentioned FIA system (FIA system for a X axis), although it is not shown in FIG. 3.

There is provided at one side of an upper portion of the projection optical system 13 with an alignment sensor of a TTL (through the lens) system and the light from the alignment sensor 17 for detecting the position of the wafer mark is introduced into the projection optical system through mirrors M1 and M2. The light for detecting the position is irradiated to the wafer mark on the wafer W through the projection optical system and the reflected light from the wafer mark is returned to the alignment sensor 17 through the projection optical system 13, the mirror M3 and the mirror M2. The position of the wafer mark on the wafer W is obtained from a signal obtained by photoelectrically converting the reflected light returned to the alignment sensor 17.

Figure 4:
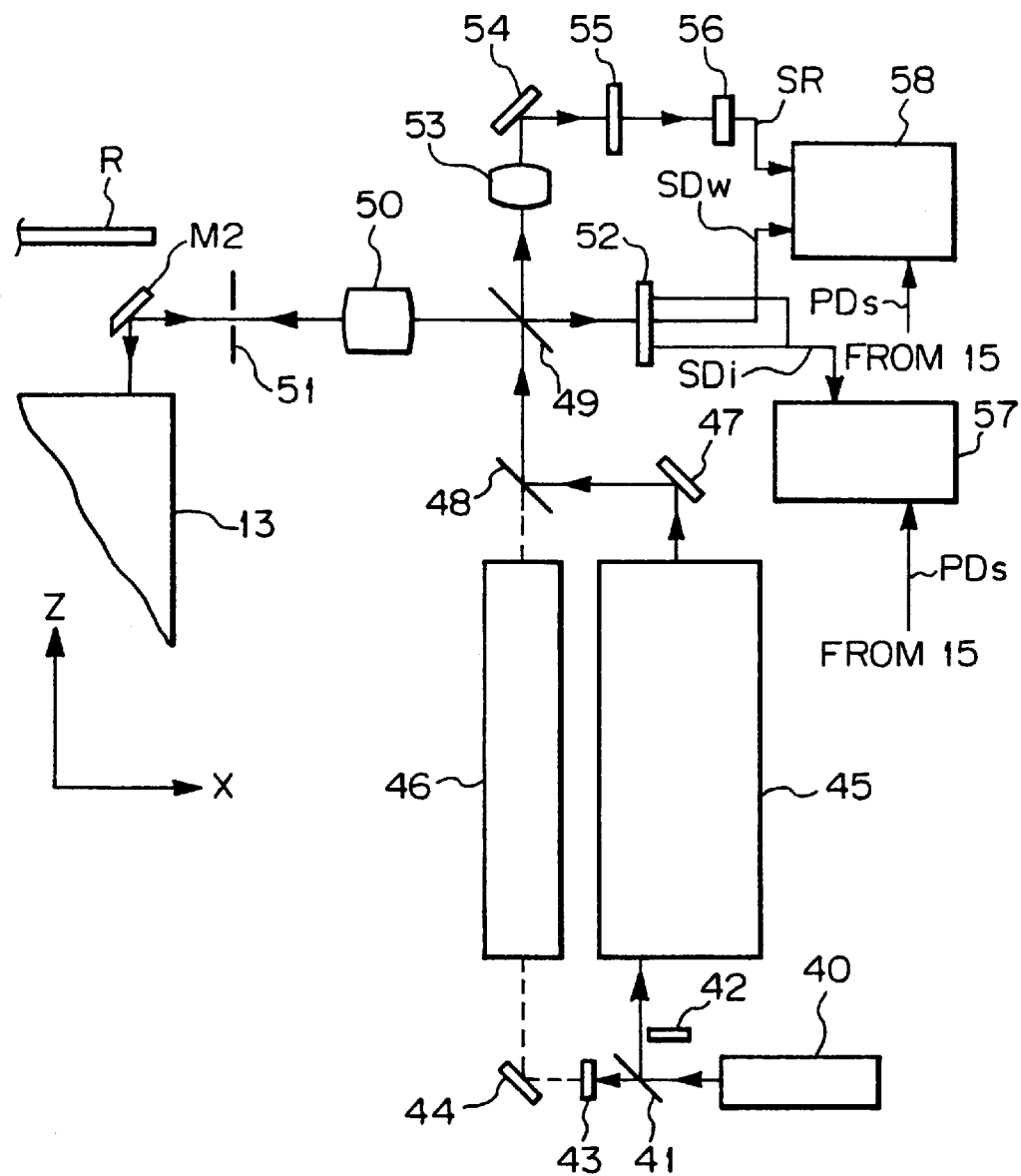
FIG. 4 is a structural view showing an alignment sensor of a LSA system and a LIA system used in the projection exposure apparatus shown in FIG. 3.

FIG. 4 shows the detailed structure of the alignment sensor 17 of the TTL system shown in FIG. 3. In FIG. 4, the alignment sensor 17 according to this embodiment is that constituted by combining an alignment system of a two-beam interference system (hereinafter referred to as "LIA system") and an alignment system of laser step alignment system (hereinafter referred to as "LSA system") with their optical members being shared as many as possible. The structure of the alignment sensor 17 will be briefly explained herein, but the detailed structure is shown in Laid Open Patent Publication No. Hei 2-272305.

In FIG. 4, a laser beam emitted from a light source (He-Ne laser source and the like) 40 is split by a beam splitter 41. A laser beam reflected by this beam splitter 41 enters into a first beam formation optical system (LIA optical system) 45 through a shutter 42. On the other hand, the laser beam having passed through the beam splitter 41 enters into a second beam formation optical system (LSA system) 46 through a shutter 43 and a mirror 44. Accordingly, the LIA system and the LSA system can be selectively used by suitably driving the shutters 42 and 43.

The LIA system 45 includes two sets of acousto-optic modulators and emits two laser beams having a predetermined frequency differential Af symmetrically with respect to the optical axis. The two laser beams emitted from the LIA, system 45 reaches to a beam splitter 49 through a mirror 47 and a beam splitter 48. Two laser beams passed through the beam splitter enter and form an image (cross) on a diffraction grating 55 for reference which is fixed on the exposure apparatus from two different directions which cross each other with a predetermined angle, through a lens system (a reverse Fourier transform surface) 53 and a mirror 54. A photoelectric detector or sensor 56 receives interfered light of diffracted light generated in the same direction when light passed through the diffraction grating 55 and output the photoelectric signal Rs having a sine wave corresponding to the intensity of diffracted light to a LIA operation unit 58 in the main control system 18 (see FIG. 3).

On the other hand, two laser beams reflected by the beam splitter 49 once cross each other at an opening of the field stop 51 by the objective lens 50 and then enter into the projection optical system 13 through the mirror M2 (in FIG. 3 mirror M1 is omitted). The two laser beams entered into the projection optical system 13 once converge as a spot substantially symmetrical with respect to the optical axis AX on a pupil surface of the projection optical system 13 and then becomes beams which incline each other on both sides of the optical axis AX with a symmetrical angle with respect to a pitch direction (y direction) of the wafer mark on the wafer W, thereafter enter to the wafer mark from the two different directions with a predetermined crossing angle. Formed on the wafer mark are one-dimensional interference fringes which move with a speed corresponding to the frequency differential. Plus or minus (±) one-dimensional diffracted light generated in the same direction from the mark, i.e., in the direction along the optical axis, is received by the photoelectric detector 52 through the projection optical system 13 and the objective lens 50. The photoelectric detector 52 outputs the photoelectric signal SD having sine wave corresponding to cycle of change in bright and dark of the interference fringes to the LIA arithmetic processing unit 58. The LIA arithmetic processing unit 58 calculates a positional offset or displacement value of the wafer mark from the phase difference in waves of the two photoelectric signals SR and SDw, and uses a positional signal PDs from the laser interferometer 15 to obtain a coordinate position of the wafer stage WS when the above positional offset value becomes zero.

The LSA optical system 46 includes beam expander, cylindrical lens and the like. The laser beam emitted from the LSA optical system 46 enters into the objective lens 51 through the beam splitter 48 and 49. Moreover, the laser beam exited from the objective lens 50 once converges into a slit-like shape at an opening of the field stop 51 and then enters into the projection optical system 13 through the mirror M2. The laser beam entered into the projection optical system 13 passes through a substantially central portion of the pupil surface and thereafter is projected on the wafer W as elongated band-like spot light which extends in the X direction in an image field of the projection optical system and faces toward the optical axis AX.

When the spot light and the wafer mark (a diffraction grating) on the wafer W are moved with respect to each other in the Y direction, the light emitted from the wafer mark is received by the photoelectric detector 52 through the projection optical system and the objective lens 50. The photoelectric detector 52 photoelectrically converts only plus or minus (±) first to third diffracted lights among lights from the wafer mark, and photoelectric signal SDi thus obtained by the photoelectric conversion and corresponding to intensity of the light is outputted to the LSA arithmetic processing unit 57 in the main control system. The LSA arithmetic processing unit 57 is provided with the positional signal PDs from the laser interferometer 15 and samples the photoelectric signal SDi in synchronized with an up-down pulse generated every unit displacement of the wafer stage WS. The LSA arithmetic processing unit 57 converts sampled values into digital values and memorizes in a memory in the order of addresses, thereafter calculates the position in the Y direction of the wafer mark by predetermined arithmetic processing. The alignment sensor for the X direction for detecting the position of the wafer mark of the LIA system for the X direction and the position of the wafer mark of the LSA system may be additionally provided.

One example of the exposure operation according to the present invention will be explained with reference to a flow chart shown in FIG. 1.

Figure 1B:
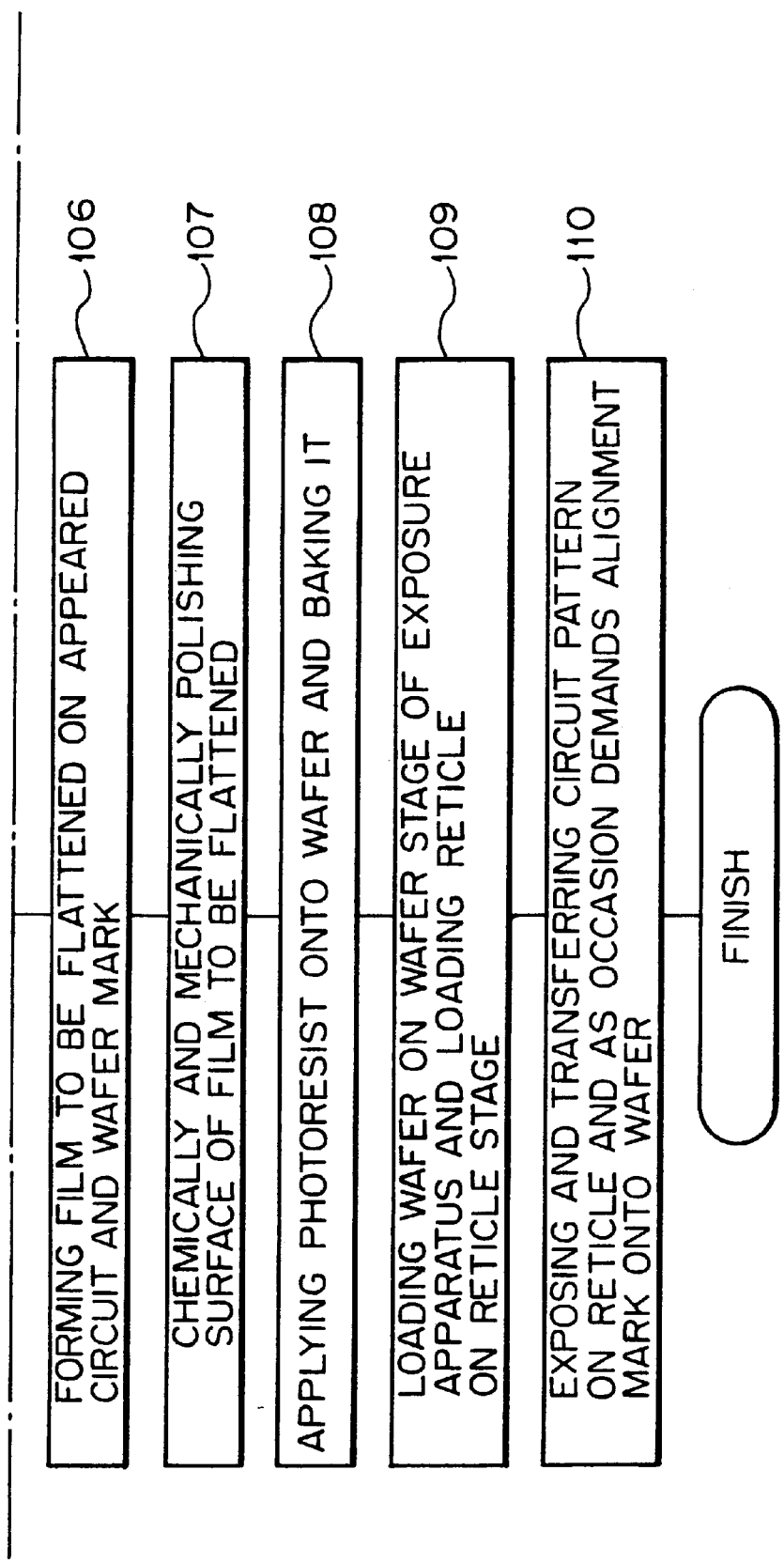
FIG. 1(b) shows the second half of the flow chart.

First of all, in a step 101 shown in FIG. 1, a photoresist is applied to the wafer W by means of an unshown coater and they are baked as occasion demands. In a step 102, the baked wafer W is loaded on the wafer stage WS of the projection exposure apparatus shown in FIG. 1 and the reticle R-shown in FIG. 5 is loaded on the reticle stage RS. Next, in a step 103, a circuit pattern and reticle marks 64X, 64Y in the pattern area 61 on the reticle R in FIG. 5(c) is projected with a reduction of 1/5 times on a photoresist layer applied to the wafer W through the projection exposure system 13. Due to this, an image of the circuit pattern is projected in a shot area SA on the wafer W and an image 70X of the reticle mark 64X and an image 70Y of the reticle mark 64Y are projected near the shot area SA as shown in FIG. 5(a). For example, the image 70X of the reticle mark 64X is constituted by separately arranging images of sub-marks 71A, 71B, 71E with the predetermined pitch along the X direction as shown in FIG. 5(b). These images 70X, 70Y of the reticle marks become wafer marks consist of a concave and convex pattern after a process such as development.

The wafer W on which images of the circuit pattern and the reticle marks 64X, 64Y on the reticle R are transferred is developed in a step 104. In a step 105, after a baking process is finished the wafer W is etched using a resist pattern as a mask and then is washed as occasion demands. A developing device used in the step 104 may adopt a spray method in which a predetermined cleaning agent and developing agent are sprayed or ejected to an object in the form of a spray or a shower, or a dip method in which the object is dipped within the developing agent and the cleaning agent for a predetermined time interval, respectively, and developed. The wafer is developed and washed by either of the above methods. Although an etching process may be performed by means of a wet method or a dry method, at present the dry method is used. In order to practice this dry etching, for example, a plasma etching device is used.

In the step 105, completion of etching is detected by a laser beam interferometry using a spectral analysis method or an optical reflection, an ellipsometric method, a grating optical diffraction method and the like. After confirming the completion of the etching the wafer W is washed as occasion demands. A resist layer and a useless oxide film portion or metallic film portion are removed as described above and, as shown in FIG. 2(b), the necessary circuit and wafer mark are formed into a concave and convex shape in a coat 73 on a coat (hereinafter referred to as circuit pattern layer) 72 on the wafer W. The wafer mark 76X is formed by an image on the wafer W which is transferred, with a rate of reduction, from the reticle mark 64X for the X axis through the projection optical system PL.

Figure 2A:
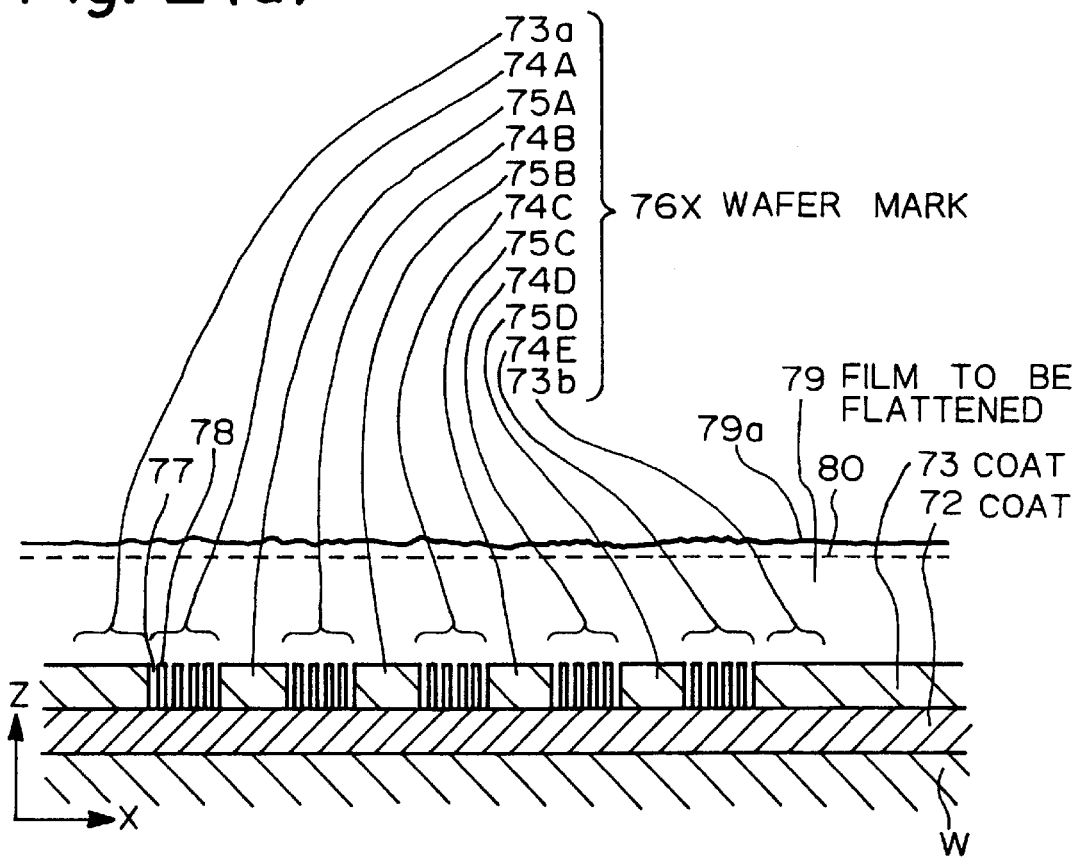
FIG. 2(a) is a cross-sectional view of the wafer mark used in the above embodiment.
Figure 2B:
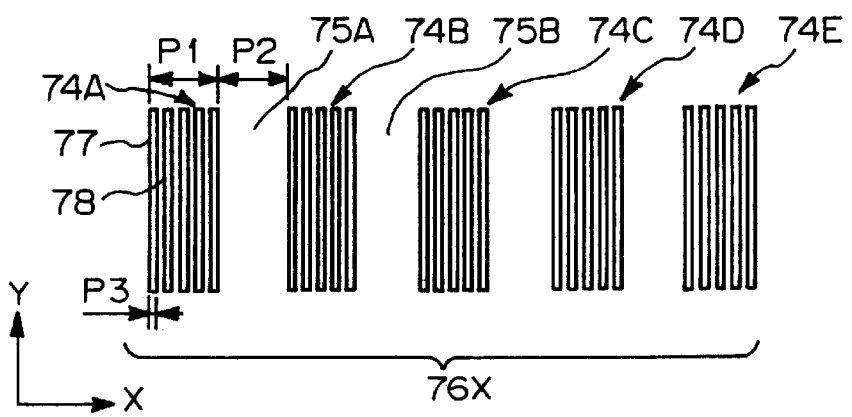
FIG. 2(b) is a plane view of the wafer mark.

FIG. 2 shows a wafer mark formed in accordance with the present invention, that is the wafer mark 76X which is formed on the wafer w by transferring the reticle mark 64X thereto. This FIG. 2 shows a layer to be flattened and made of an insulating film (a metallic film) to be explained later and is used when a flattening process is explained. FIG. 2(a) is a cross-sectional view of the wafer mark 76X for the X axis viewed along the Y axis and FIG. 2(b) is a plane view of the wafer mark 76X.

As shown in FIGS. 2(a) and 2(b) the wafer mark 76X is formed together with the circuit in the coat 73 formed on the coat 72 as explained above. The coat 73 is formed into projections or convex portion 73a, 73b on opposite sides, a plurality of projections or convex portions 75A to 75D separately arranged between the convex portions 73a and 73b with a distance of not less than a predetermined value and sub-patterns 74A to 74E each of which is made by a minute concave and convex pattern consist of projections or convex portions 78 and recesses or concave portions 77. The width P1 of each sub-pattern and the width P2 of each convex portion 75A–75D have a predetermined size, respectively (in this embodiment P1 and P2 are about 6 $\mu$m, respectively). The width P3 of each projection or convex portion and each recess or concave portion of the sub-patterns has a predetermined size, and in this embodiment P3 is about 0.67 $\mu$m.

However, this width P3 is not limited to the above value if it is such a size as the sub-pattern is detected and processed as a dark portion of the alignment sensor to be used. Although, in this embodiment the distance (that is the width of sub-pattern) P1 between adjacent convex portions of the mark 76X is about 6 $\mu$m, this distance or width is not limited to this value, if it is not less than the resolution of the alignment sensor. Preferably, the distance P1 is not less than 2 $\mu$m if possible. Since the sub-patterns 74A to 74E of the alignment sensor formed as explained above can not be resolved by a mark sensor of the FIA method, it is possible to process them as a bright and dark pattern in which the convex portions 75A to 75D of the wafer mark 76X are processed as bright portions and the sub-patterns 74A to 74E are processed as dark portions. The wafer mark Y is formed in the same manner as the wafer mark X.

As explained above, the surface on the wafer in which the predetermined circuit and the wafer mark 76X, 76Y are formed is flattened still more in order to form an upper layer circuit in steps 106 and 107. This flattening operation may be performed in the same method as explained before, however, according to this embodiment, in the step 106 an insulating film or membrane (or a metallic film or membrane, hereinafter referred to as a film to be flattened) 79 of an oxide silicon ($SiO_2$), and the like is coated. In this stage, there are minute concave portions and convex portions in a surface 79a of the film to be flattened 79. Next in the step 107, a process for chemically and mechanically grinding or polishing the surface 79a of the film to be flattened is practiced. This chemical and mechanical polishing is a method for mechanically polishing or grinding the surface of the film to be flattened adding predetermined chemicals or water as occasion demands.

Figure 10:
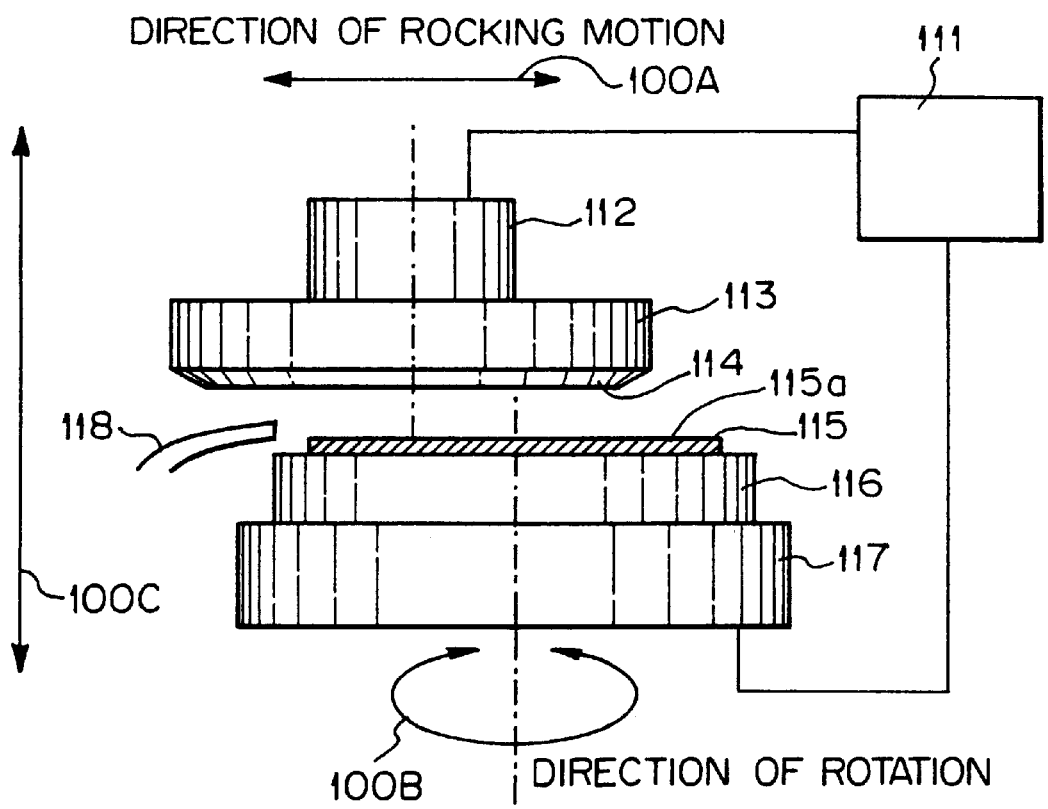
FIG. 10 is a schematic view showing a structure of one embodiment of the substrate polishing apparatus 20 according to the present invention.

FIG. 10 shows a schematic structure of one embodiment of a substrate polishing or grinding apparatus according to the present invention. In this embodiment there is shown the substrate polishing or grinding apparatus having a structure in which only a vacuum suction table 116 for holding the wafer is rotatable, that is the substrate polishing apparatus having a structure in which the vacuum suction table 116 for holding the wafer 115 is disposed on a rotary table 117 and a polishing or grinding surface plate 113 having a polishing or grinding pad 114 is held by a rocking or oscillating table 112.

The rocking table 112 rocks or oscillates in right and left directions and the speed of rocking motion thereof is controlled to a predetermined value determined by a controller 111. The rocking table 112 holds the polishing surface plate 113 and this polishing surface plate 113 is provided with a polishing pad 114 facing a face 115a (hereinafter referred to as a pattern formation surface) of wafer on which a pattern layer and an upper film are formed.

The wafer is held by suction by means of the vacuum suction table 116 with the pattern formation surface 115a which is a surface to be polished or ground facing above.

Since this vacuum suction table 116 is disposed on the rotary table 117 which is rotatable in reciprocal directions, the wafer 115 is rotatable in the reciprocal directions.

The direction of rotation 100B of the rotary table 117 is controlled so that it is reversed every predetermined times determined by the controller 111. In this embodiment, a set-up time, which is a unit for reversing the direction of rotation of the rotary table 117 can be optionally set by the user. For example, in the case where 20 minutes are needed as a processing time for the pattern formation surface 115a the set-up time may be set such that the rotary table rotates right-wards for 10 minutes and then in left-wards for 10 minutes or may be set with time difference such that the rotary table rotates right-wards for 8 minutes and then in left-wards for 12 minutes, if extent of progress of asymmetry of the cross-section in the region between the patterns differs in relation to the direction of rotation.

Moreover, in the case where extent of progress of asymmetry of the cross-section in the region between the patterns does not differ in relation to the direction of rotation, for example if direction of rotations is changed between right-ward rotation and left ward rotation every one or more minutes or every one or more revolutions of the 25 rotary table, a wafer having a complete symmetrical cross-section of pattern can be obtained, since the time at which the rotary table rotates in one direction is short thereby reducing extent of progress of asymmetry.

In this embodiment the substrate polishing apparatus is structured such that the speed of rotation and the speed of rocking motion of the rotary table 117 is controlled by the controller 111. Therefore, finishing time and finishing state of polishing of the pattern formation surface of the wafer 115 can be controlled by controlling rotation and rocking motion of the rotary table by means of the controller in response to commands of the set-up time and the speed of rotation set by the user.

Furthermore, the pattern formation surface 115a of the wafer is well polished by injecting the polishing agent between the pattern formation surface 115a and the polishing pad 114 from the polishing agent supplying nozzle 118 and by moving at least one of the vacuum suction table 116 and the polishing surface plate 113 in up and down direction 100c by means of instructions from the controller 111 to contact the polishing pad 114 moving in response to the rocking motion of the polishing surface table 113 and the wafer rotating in response to rotation of the rotary table 117.

In the above explained embodiment the vacuum suction table 116 is rotated and the polishing surface plate 113 is rocked or oscillated. However, same technical advantages as explained above is obtained by rotating the polishing surface plate 113 and rocking or oscillating the vacuum suction table 116. Moreover, the same technical advantage as explained above is obtained by a structure in which the vacuum suction table 116 and the polishing surface plate 113 are rotatable.

FIG. 2(a) shows the wafer W, particularly the state of a surface 80 of the film 79 on the wafer W, which is flattened by the method explained above. The surface 80 of the film to be flattened 79 does not sink above the wafer mark 76X and form a smooth plane. This is because no recesses or concave portions having a width of not less than 2 $\mu$m are formed between the adjacent convex portions among the convex portions 76A to 76D by positioning minute sub-patterns 74A to 74E in the spaces between the adjacent convex portions and flatness of the film to be flattened 79 above the wafer mark 76X can be obtained.

In a step 108, a photoresist is applied again on the wafer W having a film to be flattened 79 the surface of which is flattened by the process explained above. In this case, for example, a photoresist applying device (coater) of a spin coat method in which thin film of the photoresist is formed on the wafer W by using centrifugal force is used. The wafer W on which the photoresist is applied is set on the wafer stage of the above-mentioned projection optical system, a projection optical system adapted to practice the exposure method according to the present embodiment or a conventional pattern formation device. At this time the wafer marks 76X, 76Y are detected by the alignment sensor of the FIA system through flattened film and alignment of the wafer is performed.

In the wafer mark of the LSA system or the LIA system, detection and alignment of the wafer mark can be performed same as that of the FIA system by using alignment sensor for the LSA system or the LIA system.

Again, in a step 110, a new circuit pattern and, if occasion demands, a new wafer mark is formed using another reticle. At this time, in a position at which the new wafer mark is formed there is no dish-like concave portion due to dishing phenomenon explained before and a stable wafer mark having no mark distortion is formed on the surface 80 of the film to be flattened 79 on the wafer.

Figure 6A:
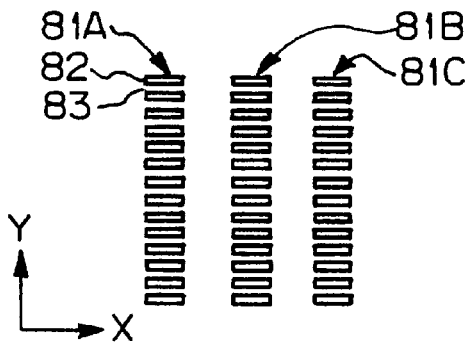
FIGS. 6(a) to 6(c) are views showing other examples of wafer mark of the FIA system, FIG. 6(a) being an enlarged plane view showing wafer mark in which a minute sub-pattern is formed into a line-and-space pattern, FIG. 6(b) being an enlarged plane view showing a wafer mark in which the minute sub-pattern is formed into a two dimensional check and FIG. 6(c) being an enlarged plane view showing a wafer mark in which the sub-pattern is formed into random dots.
Figure 6B:
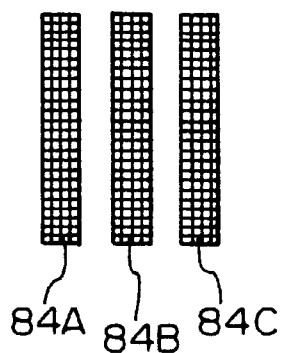
Figure 6C:
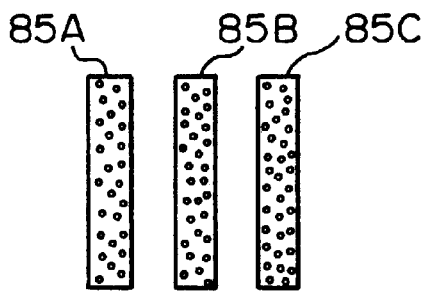

FIGS. 6(a) to 6(c) show another embodiment of a wafer mark for the X axis of the FIA system which is used in the exposure method according to the present invention. FIG. 6(a) shows a wafer mark of a line-and-space pattern which is formed by arranging minute sub-patterns along the non-measuring direction. This wafer mark is constituted by line marks 81A, 81B and 81C each of which consists of a plurality of projections or convex portions 83 and a plurality of recesses or concave portions 82 having a width not more than a predetermined value. The line marks 81A, 81B and 81C are formed by alternately and separately arranging the concave portions 82 and convex portions 83 with a predetermined pitch in the Y direction. FIG. 6(b) shows a wafer mark in which minute sub-patterns are two-dimensional lattice shape. This wafer is constituted by line marks 84A, 84B and 84C each having minute lattice-shaped concave and convex pattern. The line marks 84A, 84B and 84C are separately arranged with a distance of not less than a predetermined value in the same manner as the line marks shown in FIG. 6(a). FIG. 6(c) shows a wafer mark in which minute sub-patterns are random dots shape. This wafer is constituted by line marks 85A, 85B and 85C each having dot-shaped projections or convex portions which are randomly arranged. The line marks 85A, 85B and 85C are separately arranged with a distance of not less than a predetermined value in the same manner as the line marks shown in FIGS. 6(a) and 6(b). These alignment marks having minute sub-patterns can be used not only in the FIA system but also in the LSA system, the LIA system, and the like.

The line marks (81A, 81B or 81C), the line marks (84A, 84B or 84C) and the line marks (85A, 85B and 85C) which are explained above correspond to one of sub-patterns (74A, 74B, 74C, 74D or 74E) of the wafer mark 76X shown in FIG. 2(b), and therefore the former may be used in place of the latter.

Figure 7:
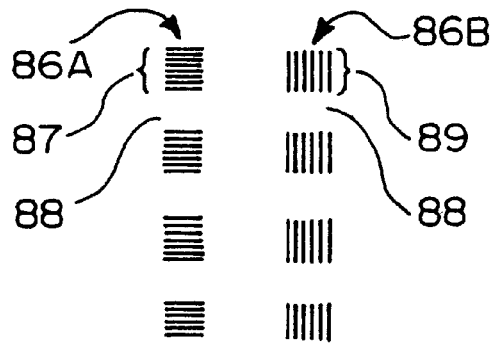
FIG. 7 is an enlarged plane view showing an example of a wafer mark for the LSA system.
Figure 8A:
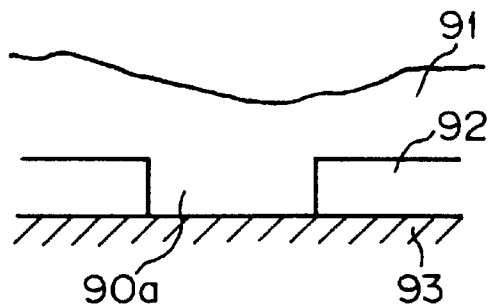
FIGS. 8(a) and 8(b) are views explaining creation of a dish-like portion according to a prior art technique.
Figure 8B:
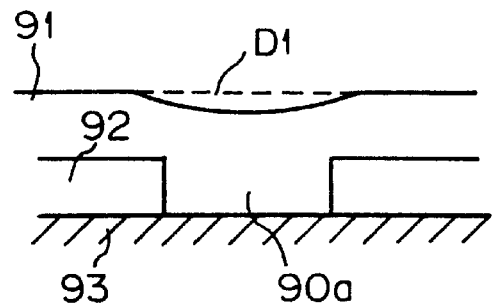
Figure 9A:
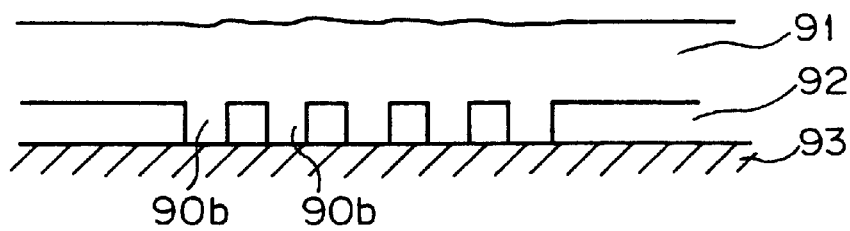
FIGS. 9(a) to 9(c) are views showing a state where the dish-like portion is created on the wafer mark of the prior art.
Figure 9B:
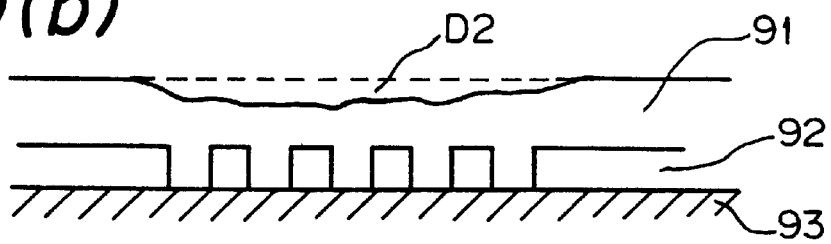
Figure 9C:
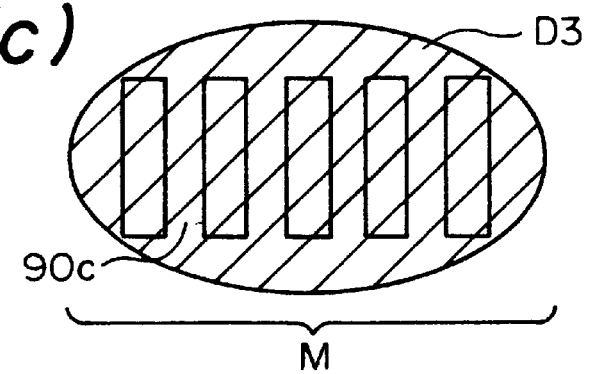

FIG. 7 shows a wafer mark for the LSA system. This wafer mark includes a pattern 86A which is a combination of a plurality of minute sub-patterns 87 each of which consists of a slit-shaped convex and concave pattern in which slits extend along the X axis and a plurality of projections or convex portions 88, and a pattern 86B which is a combination of a plurality of minute sub-patterns 87, 89 each of which consists of a minute convex and concave pattern which extend along the Y axis and a plurality of projections or convex portions 88. Wafer marks other than described above can be used in the exposure method according to the present invention.

The exposure method according to the present invention can also be used in an exposure apparatus of a step-and-scan method wherein exposure is performed scanning the reticle and wafer at the same time. Thus, the scope of the present invention is not limited to the above embodiments and it is possible for those skilled in the art to take many modifications within the scope of the present invention.

According to the exposure method no dishing phenomenon is created above the alignment mark even after a flattening process is performed. Accordingly, the creation of distortion in the detected light of the alignment mark is prevented when alignment of the wafer is performed to increase accuracy of the alignment. Moreover, it is not necessary to modify a mechanism in an exposing and transferring apparatus and therefore the structure thereof is simple.

In the case where the distance between adjacent convex portions of alignment mark is not less than 2 μm, the alignment mark can be detected by means of a conventional alignment sensor having ordinal resolution. If the distance between adjacent convex portions of the alignment mark is not less than 2 μm, it is easy to create dishing phenomenon, but according to the present invention, creation of dishing is prevented.

Moreover, dishing is prevented from creating in the above alignment mark made by exposing and transferring mark using a mask according to the present invention. This prevents creation of distortion of marks and enables highly precise alignment.

Figure 11:
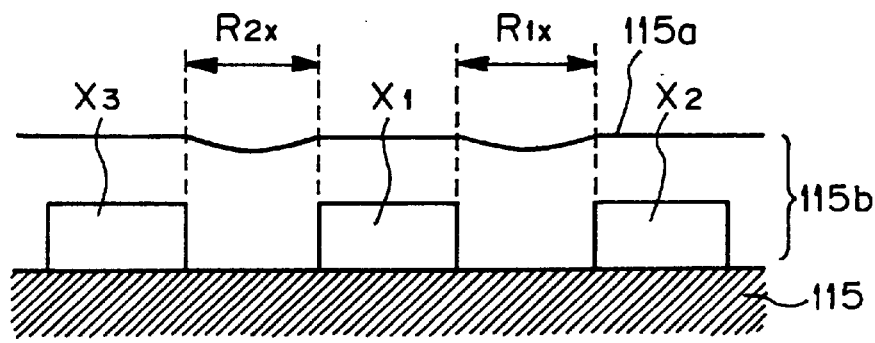
FIG. 11 is a view illustrating the main portion of the cross-section of the wafer polished by the substrate polishing apparatus according to the present invention.
Figure 12:
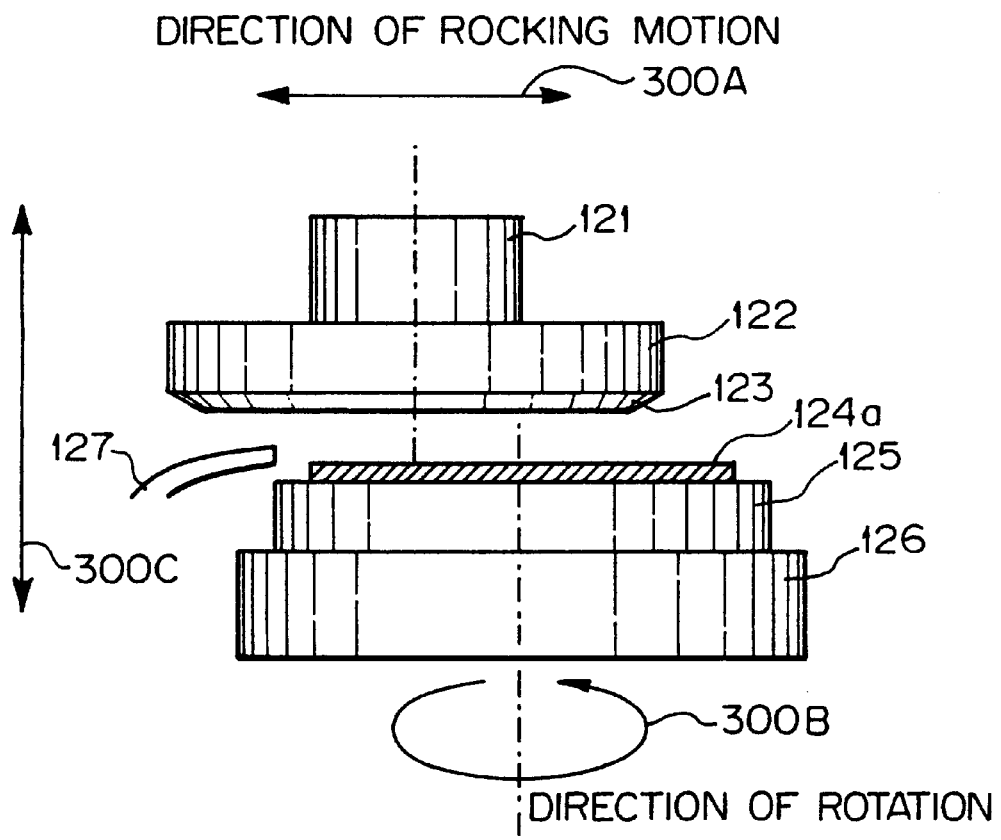
FIG. 12 is a schematic view showing a structure of one example of a conventional substrate polishing apparatus.
Figure 13:
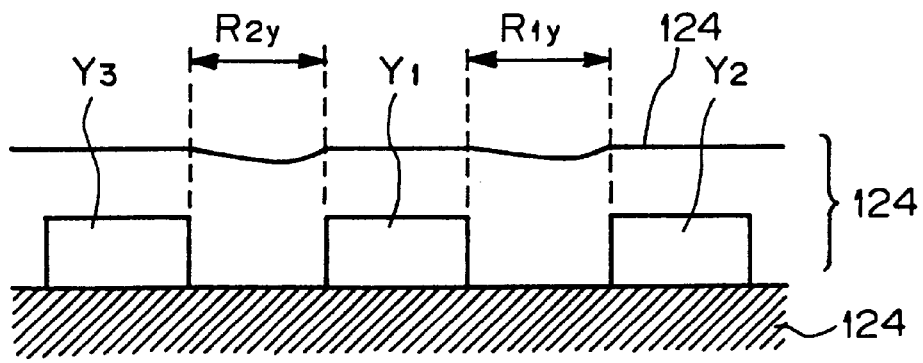
FIG. 13 is a view illustrating the main portion of the cross-section of the wafer polished by the conventional substrate polishing apparatus.

Furthermore, according to the substrate polishing apparatus of the present invention the film can be polished so that the film thickness of each pattern becomes symmetrical. Namely, as is clear from FIG. 11, a polishing force (intensity of polishing) in regions $R_{1X}$, $R_{2X}$ (hereinafter called as regions between patterns) between a pattern X formed on the wafer 115 and other patterns $X_2$, $X_3$ adjacent to the pattern $X_1$ do not deviate in one direction in the regions $R_{1X}$, $R_{2X}$ and the surface 115a of the wafer 115 is grounded symmetrically in the regions $R_{1X}$, $R_{2X}$ thereby making the film thickness 115b symmetrical. If patterns $X_1$, $X_2$ and $X_3$ constitutes an alignment mark, the surface of film in the regions $R_{1X}$, $R_{2X}$ between patterns sinks symmetrically. This reduce effects on detection of alignment mark.

While the invention has been particularly shown and described in reference to preferred embodiments thereof, it will be understood by those skilled in the art that changes in form and details may be made therein without departing from the spirit and scope of the invention.

What is claimed is:

1. A mask formed with an original pattern of alignment mark together with a pattern to be transferred, wherein the original pattern of said alignment mark is formed by disposing, between adjacent bright portions having a width of not less than a predetermined value, one or more bright patterns having a width of less than said predetermined value with a pitch less than said predetermined value.

2. A mask according to claim 1, wherein the maximum value of said pitch is determined so that a concave and convex pattern formed by transferring said bright pattern on said mask onto a substrate is not more than resolution of an alignment sensor.

3. A mask according to claim 2, wherein said bright pattern is regularly arranged.

4. A mask according to claim 2, wherein said bright pattern is irregularly arranged.

5. An exposure method comprising:
   using the mask as set forth in claim 1 and forming an alignment mark on said substrate by projecting an alignment mark on said mask onto said substrate.

6. An exposure apparatus for exposing a substrate by projecting a pattern on a mask onto the substrate, comprising:
   a mask holding member which holds the mask as set forth in claim 1, and
   a projection system which projects an alignment mark on the mask onto the substrate.

7. A mask formed with an original pattern of alignment mark together with a pattern to be transferred, wherein the original pattern of said alignment mark is formed by disposing, between adjacent dark portions having a width of not less than a predetermined value, one or more dark patterns having a width of less than said predetermined value with a pitch of less than said predetermined value.

8. A mask according to claim 7, wherein the maximum value of said pitch is determined so that a concave and convex pattern formed by transferring said dark pattern on said mask onto a substrate is not more than resolution of an alignment sensor.

9. A mask according to claim 7, wherein said dark pattern is regularly arranged.

10. A mask according to claim 7, wherein said dark pattern is irregularly arranged.

11. An exposure method comprising:

using the mask as set forth in claim 7 and forming an alignment mark on said substrate by projecting an alignment mark on said mask onto said substrate.

12. An exposure apparatus for exposing a substrate by projecting a pattern on a mask onto the substrate, comprising:

a mask holding member which holds the mask as set forth in claim 7, and a projection system which projects an alignment mark on the mask onto the substrate.

13. An exposure apparatus comprising:

a projection optical system which projects an image of a mark on a mask onto a substrate to form an alignment mark on said substrate; and an alignment sensor which detects said alignment mark formed on said substrate, wherein said alignment mark includes a plurality of first patterns having a height and a second pattern for preventing a file covering the alignment mark from being depressed.

14. An exposure apparatus according to claim 13, wherein the distance between each of a plurality of said second patterns is less than resolution of said alignment sensor.

15. An exposure apparatus according to claim 14, wherein said second patterns are regular.

16. An exposure apparatus according to claim 14, wherein said second patterns are irregular.

17. An exposure apparatus according to claim 13, wherein the distance between adjacent first patterns is equal to or more than 2 $\mu$m.

18. An exposure apparatus according to claim 13, wherein said alignment sensor includes an alignment system of an image processing type which picks up an image of said alignment mark to measure the position of said alignment mark.

19. An exposure apparatus according to claim 13, wherein said alignment sensor includes an alignment system of an interference type which measures the position of said alignment mark by using interference of light from said alignment mark.

* * * * *

UNITED STATES PATENT AND TRADEMARK OFFICE
CERTIFICATE OF CORRECTION

PATENT NO. : 6,566,022 B2
APPLICATION NO. : 09/930310
DATED : May 20, 2003
INVENTOR(S) : Shinji Mizutani et al.

It is certified that error appears in the above-identified patent and that said Letters Patent is hereby corrected as shown below:

On the Title Page:
Item "(75) Inventors" should be --Inventor: Shinji Mizutani, Kanagawa-ken (JP)-- only.
Change "(*) Notice: Subject to any disclaimer, the term of this patent is extended or adjusted under 35 U.S.C. 154(b) by 0 days."
to be
--(*) Notice: Subject to any disclaimer, the term of this patent is extended or adjusted under 35 U.S.C. 154(b) by 0 days.
    This patent is subject to a terminal disclaimer.--

Signed and Sealed this

Twenty-fourth Day of March, 2009

JOHN DOLL
*Acting Director of the United States Patent and Trademark Office*